US009954058B1

(12) United States Patent
Mochizuki et al.

(10) Patent No.: US 9,954,058 B1
(45) Date of Patent: Apr. 24, 2018

(54) SELF-ALIGNED AIR GAP SPACER FOR NANOSHEET CMOS DEVICES

(71) Applicant: International Business Machines Corporation, Armonk, NY (US)

(72) Inventors: Shogo Mochizuki, Clifton Park, NY (US); Alexander Reznicek, Troy, NY (US); Joshua M. Rubin, Albany, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/620,437

(22) Filed: Jun. 12, 2017

(51) Int. Cl.
| | |
|---|---|
| *H01L 29/06* | (2006.01) |
| *H01L 29/423* | (2006.01) |
| *H01L 29/417* | (2006.01) |
| *H01L 29/16* | (2006.01) |
| *H01L 29/04* | (2006.01) |
| *H01L 29/66* | (2006.01) |
| *H01L 29/78* | (2006.01) |

(52) U.S. Cl.
CPC ........ *H01L 29/0649* (2013.01); *H01L 29/045* (2013.01); *H01L 29/0673* (2013.01); *H01L 29/16* (2013.01); *H01L 29/41741* (2013.01); *H01L 29/42356* (2013.01); *H01L 29/66545* (2013.01); *H01L 29/66666* (2013.01); *H01L 29/7827* (2013.01)

(58) Field of Classification Search
CPC .................. H01L 29/42392; H01L 29/0649
See application file for complete search history.

(56) References Cited

U.S. PATENT DOCUMENTS

| | | | |
|---|---|---|---|
| 8,513,067 | B2 | 8/2013 | Huang et al. |
| 9,362,355 | B1 | 6/2016 | Cheng et al. |
| 9,368,572 | B1 | 6/2016 | Cheng et al. |
| 9,425,291 | B1 | 8/2016 | Balakrishnan et al. |
| 9,461,114 | B2 | 10/2016 | Obradovic et al. |
| 2013/0221414 | A1 | 8/2013 | Zhao et al. |
| 2015/0303258 | A1 | 10/2015 | Kuhn et al. |
| 2016/0020305 | A1 | 1/2016 | Obradovic et al. |
| 2016/0190239 | A1 | 6/2016 | Suk et al. |
| 2017/0194430 | A1* | 7/2017 | Wood .................. H01L 29/0673 |

OTHER PUBLICATIONS

List of IBM Patents or Patent Applications Treated as Related, dated Nov. 14, 2017, 2 pages.

* cited by examiner

*Primary Examiner* — Thomas L Dickey
(74) *Attorney, Agent, or Firm* — Scully, Scott, Murphy & Presser, P.C.; Daniel P. Morris, Esq.

(57) ABSTRACT

A semiconductor structure is provided that contains a plurality of vertically stacked and spaced apart semiconductor nanosheets in which an inner dielectric liner and an air gap are present. Collectively, each inner spacer and air gap combination provides an inner spacer structure that separates a portion of a functional gate structure that surrounds each semiconductor nanosheet from a portion of a source/drain (S/D) semiconductor material structure that is present on each side of the functional gate structure.

11 Claims, 12 Drawing Sheets

US 9,954,058 B1

SELF-ALIGNED AIR GAP SPACER FOR NANOSHEET CMOS DEVICES

BACKGROUND

The present application relates to a semiconductor structure and a method of forming the same. More particularly, the present application relates to a semiconductor structure that includes an inner spacer structure that is positioned between each semiconductor nanosheet of a vertical stack of semiconductor nanosheets, wherein the inner spacer structure further separates a functional gate structure that surrounds each semiconductor nanosheet from a source/drain (S/D) semiconductor material structure that is present on each side of the functional gate structure. The present application also relates to a method of forming such a semiconductor structure.

As semiconductor integrated circuits (ICs) or chips become smaller, vertically stacked semiconductor nanosheets, which are two-dimensional nanostructures in which the vertical thickness is substantially less than the width, are increasingly being used. Semiconductor nanosheets are seen as a feasible device option for 7 nm and beyond scaling of semiconductor devices. Vertically stacked semiconductor nanosheets provide area efficiency and can provide increased drive current within a given layout.

The general process flow for semiconductor nanosheet formation involves the formation of a material stack that contains sacrificial layers of silicon germanium between silicon nanosheets. After removing the sacrificial layers, vertically stacked and suspended silicon nanosheets are provided. A functional gate structure can be formed above and below each silicon nanosheet to provide a gate-all-around design.

In the formation of semiconductor nanosheet containing devices, there is a need for providing an inner spacer structure for disconnecting the sacrificial layers from the epitaxy that forms the source/drain (S/D) semiconductor material structures, and to provide a more controllable means for recessing the sacrificial layers.

SUMMARY

A semiconductor structure is provided that contains a plurality of vertically stacked and spaced apart semiconductor nanosheets in which an inner dielectric liner and an air gap are present. Collectively, each inner spacer and air gap combination provides an inner spacer structure that separates a portion of a functional gate structure that surrounds each semiconductor nanosheet from a portion of a source/drain (S/D) semiconductor material structure that is present on each side of the functional gate structure.

In one aspect of the present application, a semiconductor structure is provided. In one embodiment, the semiconductor structure may include a plurality of vertically stacked and spaced apart semiconductor nanosheets suspended above a substrate, each semiconductor nanosheet having a pair of vertical end sidewalls. A functional gate structure surrounds a portion of each semiconductor nanosheet of the plurality of vertically stacked and spaced apart semiconductor nanosheets. A source/drain (S/D) semiconductor material structure extends from each vertical end sidewall of the semiconductor nanosheets and is located on each side of the functional gate structure. An inner spacer liner is located between each of the semiconductor nanosheets and physically contacts sidewalls of the functional gate structure, and an air gap is positioned between each inner spacer liner and each source/drain (S/D) semiconductor material structure.

In another aspect of the present application, a method of forming a semiconductor structure is provided. In one embodiment, the method may include providing a fin stack of alternating layers of first semiconductor nanosheets and second semiconductor nanosheets located on a surface of a substrate, wherein a sacrificial gate structure and a gate spacer straddle over a portion of the fin stack. Next, each first semiconductor nanosheet is recessed to provide a gap between each second semiconductor nanosheet. An inner spacer liner is then formed in a portion of each gap and contacting a remaining portion of one of the first semiconductor nanosheets. Next, a source/drain (S/D) semiconductor material structure is formed from each vertical end sidewall of each second semiconductor nanosheet. During the formation of the source/drain (S/D) semiconductor material structures, an air gap is formed between the inner dielectric liner and each source/drain (S/D) semiconductor material structure. The sacrificial gate structure and each remaining first semiconductor nanosheet are then replaced with a functional gate structure.

semiconductor material structure from vertical end sidewalls of each second semiconductor nanosheet, wherein during the forming of the source/drain (S/D) semiconductor material structures, an air gap is formed between the inner dielectric liner and each source/drain (S/D) semiconductor material structure.

Figure 9:
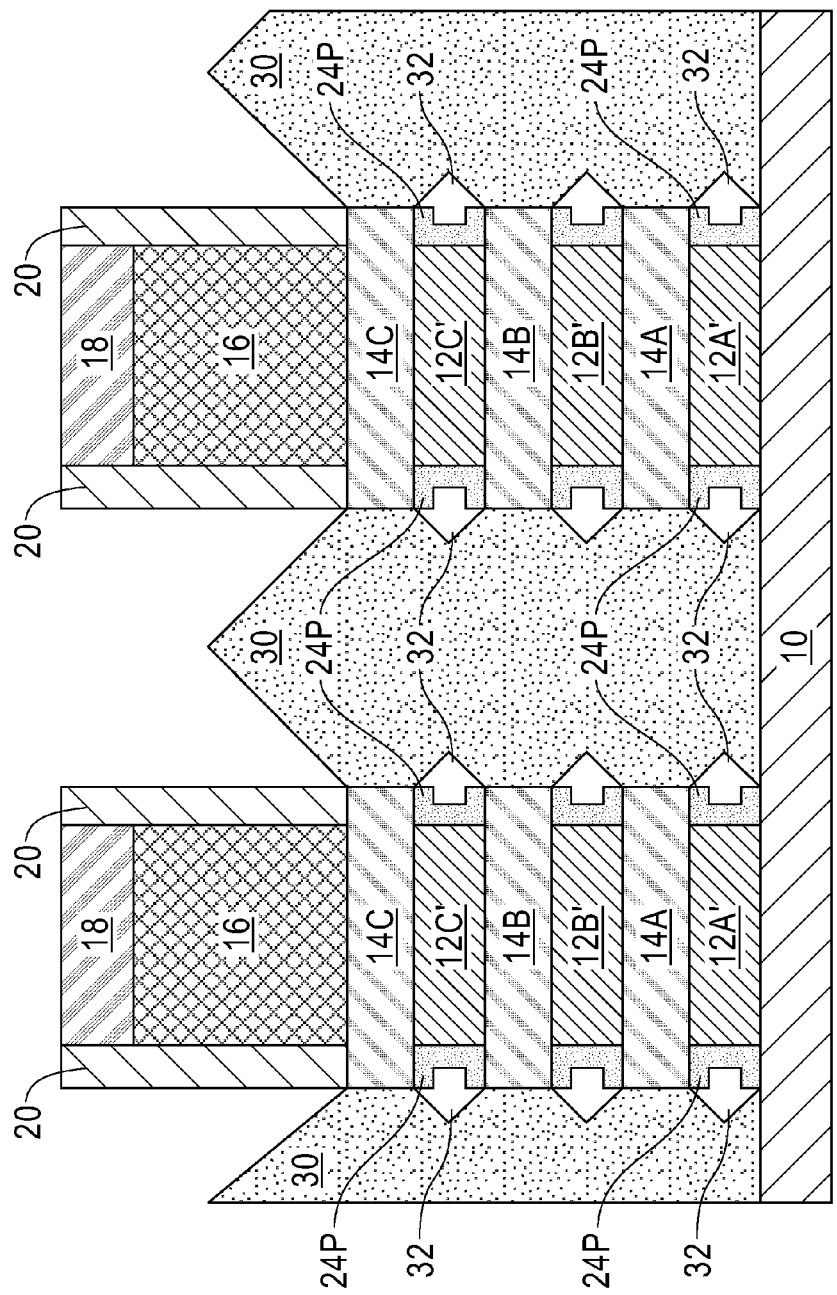
FIG. 9 is cross sectional view of the exemplary semiconductor structure of FIG. 8 after forming a source/drain (S/D)
Figure 10:
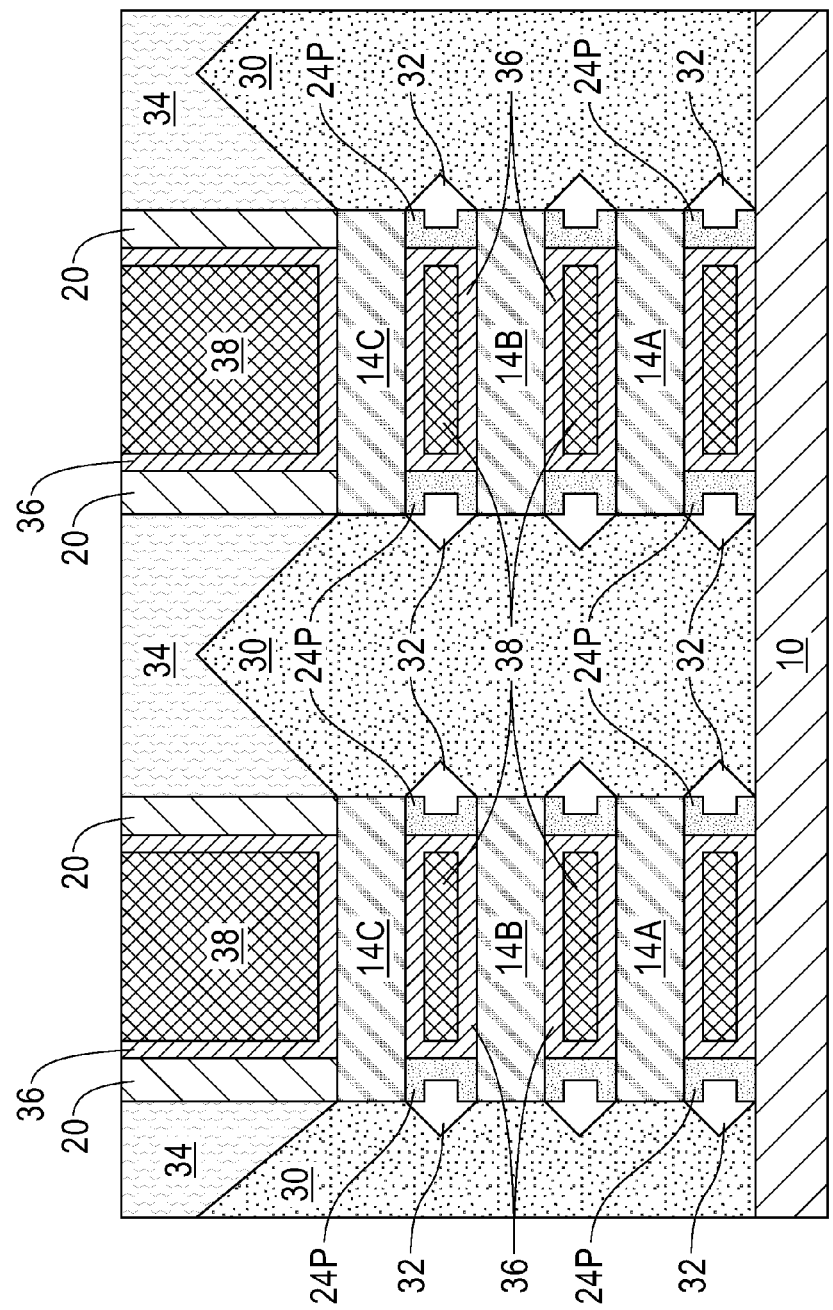

FIG. 10 is a cross sectional view of the exemplary semiconductor structure of FIG. 9 after replacing the sacrificial gate structure and each remaining first semiconductor nanosheet with a functional gate structure.

Figure 7:
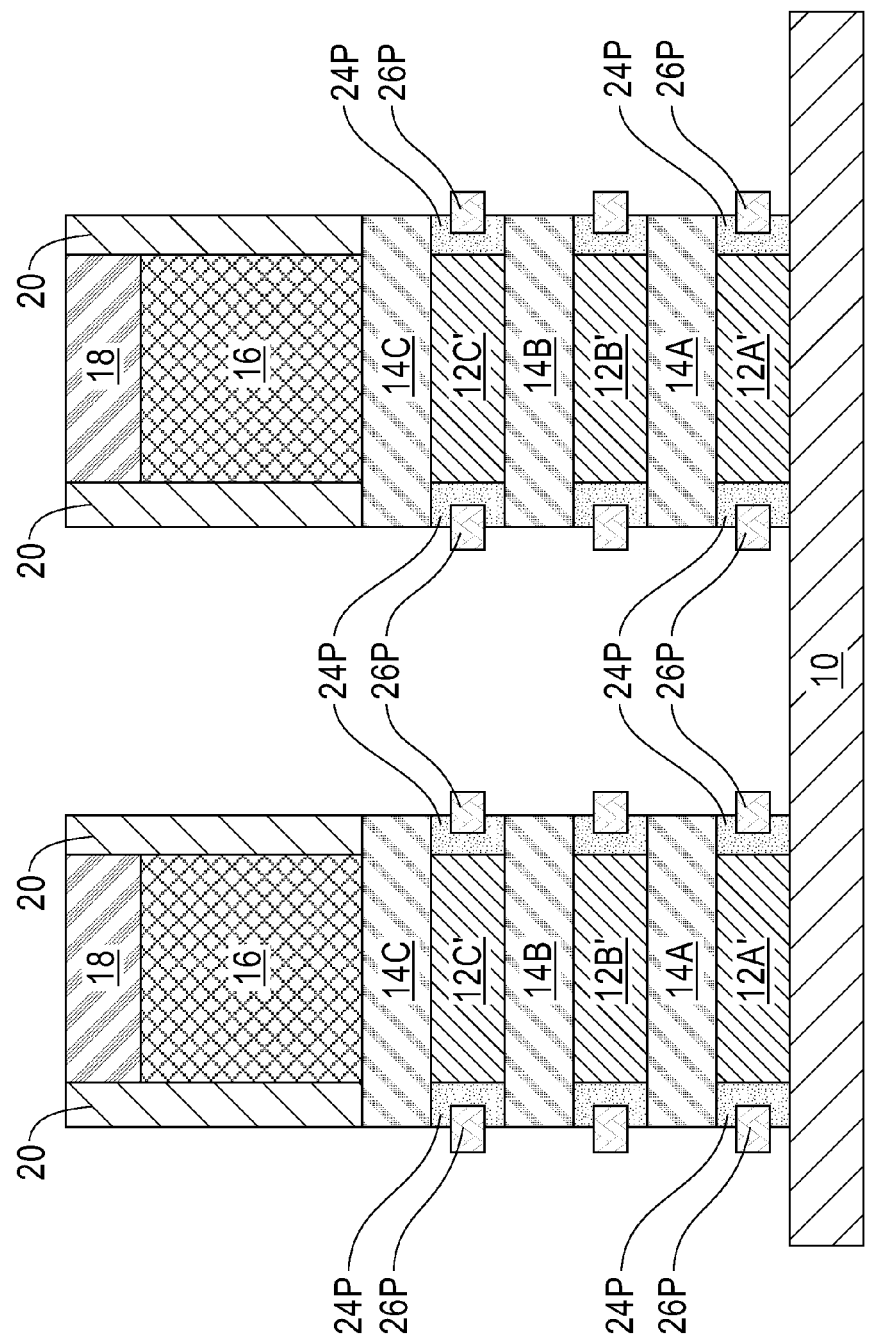
FIG. 7 is a cross sectional view of the exemplary semiconductor structure of FIG. 6 after removing the inner spacer material layer not protected by the remaining portion of the dielectric material layer in each gap, while maintaining a portion of the inner spacer material layer in each gap.
Figure 11:
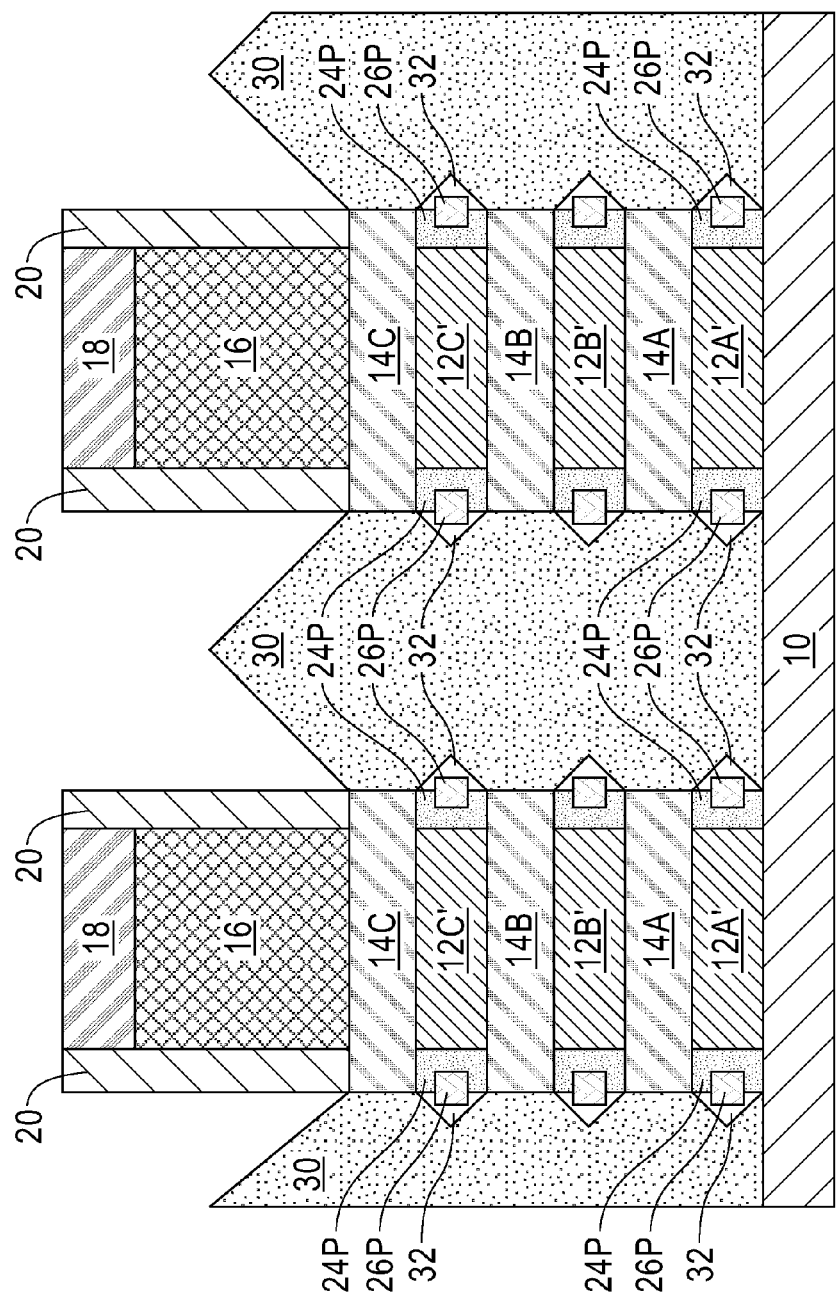

FIG. 11 is a cross sectional view of the exemplary structure of FIG. 7 after forming a source/drain (S/D) semiconductor material structure from vertical end sidewalls of each second semiconductor nanosheet, wherein during the forming of the source/drain (S/D) semiconductor material structures, an air gap is formed between the inner dielectric liner and each source/drain (S/D) semiconductor material structure.

Figure 12:
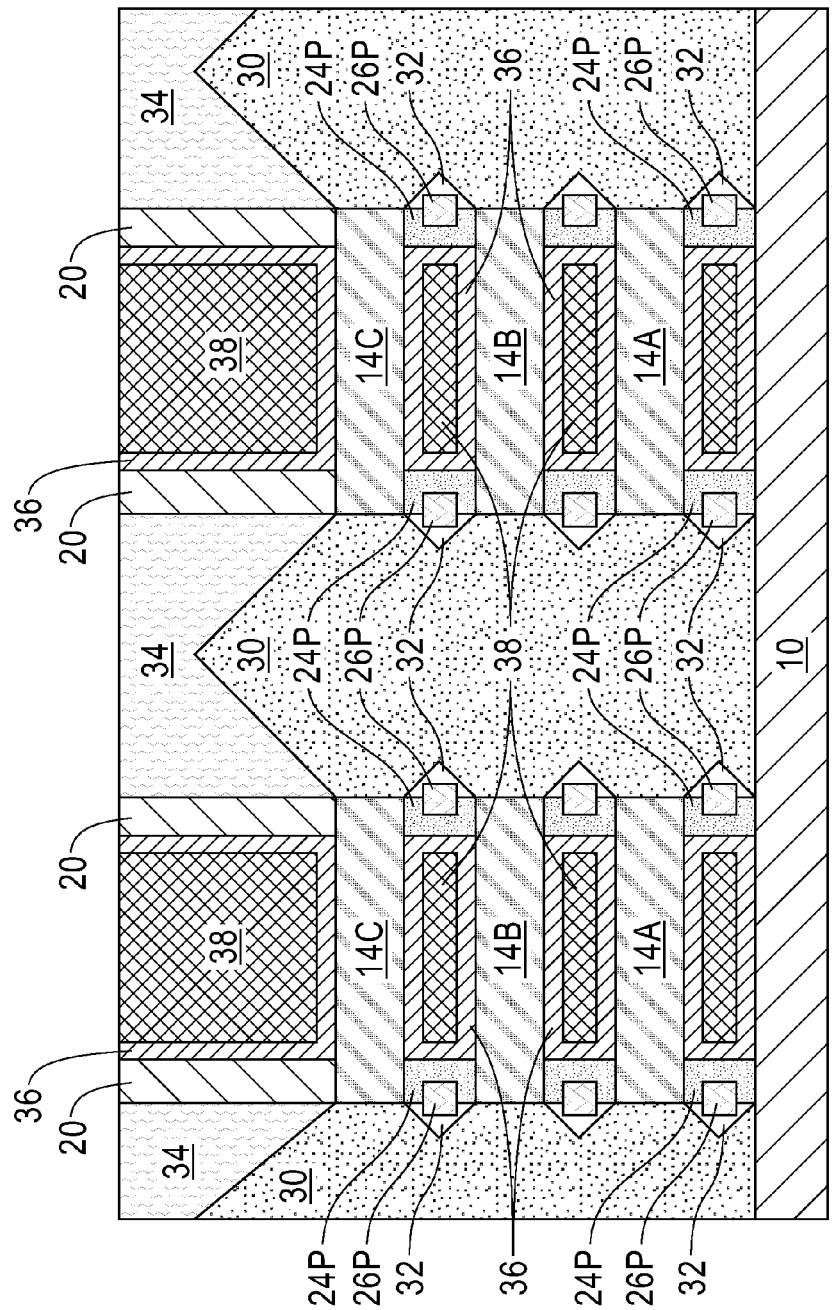

FIG. 12 is a cross sectional view of the exemplary semiconductor structure of FIG. 11 after replacing the sacrificial gate structure and each remaining first semiconductor nanosheet with a functional gate structure.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
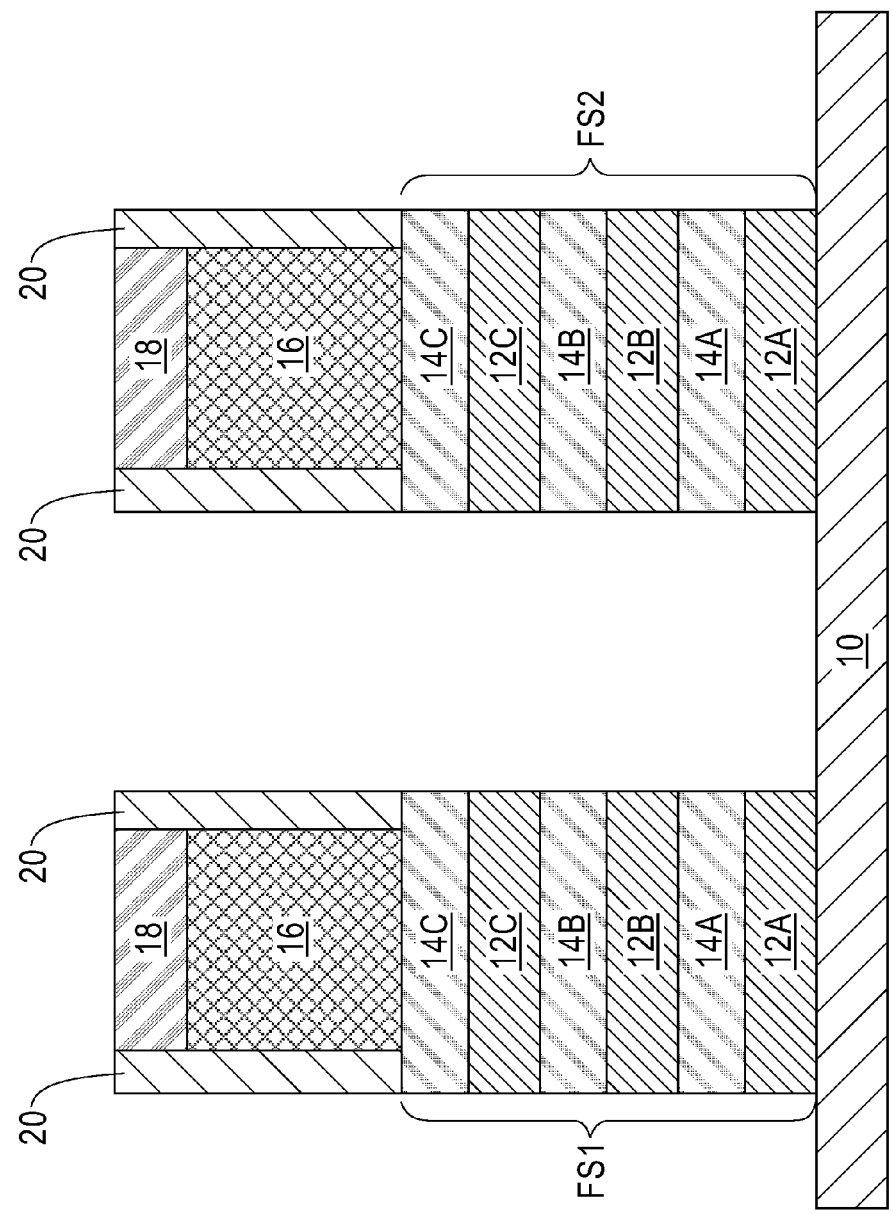
FIG. 1 is a cross sectional view of an exemplary semiconductor structure including at least one fin stack of alternating layers of first semiconductor nanosheets and second semiconductor nanosheets located on a surface of a substrate, wherein a sacrificial gate structure and a gate spacer straddle over a portion of the at least one fin stack that can be employed in accordance with an embodiment of the present application.

Referring to FIG. 1, there is illustrated an exemplary semiconductor structure that can be employed in accordance with an embodiment of the present application. The exemplary structure of FIG. 1 includes at least one fin stack (FS1 or FS2) of alternating layers of first semiconductor nanosheets (12A, 12B, 12C, etc.) and second semiconductor nanosheets (14A, 14B, 14C, etc.) located on a surface of a substrate 10; no other materials are present in the fin stacks thus the fin stacks may be said to consist of alternating layers of first semiconductor nanosheets (12A, 12B, 12C, etc.) and second semiconductor nanosheets (14A, 14B, 14C, etc.).

As is shown, a sacrificial gate structure (16, 18) and a gate spacer 20 straddle over a portion of the at least one fin stack (FS1 or FS2). In FIG. 1, and by way of one example, two fin stacks F1 and F2 are shown. The present application is not limited to two fin stacks, but instead can be used when a single fin stack or more the two fin stacks are present. By "straddling" it is meant that a first portion of a first material is located on one side of a second material, and another portion of the first material is located on another side of the second material, and wherein yet a further portion of the first material is present above a topmost surface of the second material.

In the embodiment illustrated in FIG. 1, each fin stack (F1 and F2) consists of three first semiconductor nanosheets (12A, 12B and 12C) and three second semiconductor nanosheets (14A, 14B and 14C). The number of first semiconductor nanosheets and the number of second semiconductor nanosheets is not limited to three. Instead, any number of first semiconductor nanosheets and any number of second semiconductor nanosheets may be present in the fin stack as long a first semiconductor nanosheet is located beneath each second semiconductor nanosheet.

Each first semiconductor nanosheet (12A, 12B, 12C, etc.) is composed of a first semiconductor material, while each second semiconductor nanosheet (14A, 14B, 14C, etc.) is composed of a second semiconductor material. The term "semiconductor material" is used throughout the present application to denote a material that has semiconducting properties. Exemplary semiconductor materials that may be used in the present application include silicon (Si), germanium (Ge), a silicon germanium alloy (SiGe), silicon carbide (SiC), silicon germanium carbide (SiGeC), III-V compound semiconductors or II-VI compound semiconductors.

In accordance with the present application, the first semiconductor material that provides each first semiconductor nanosheet (12A, 12B, 12C, etc.) differs in composition from the second semiconductor material that provides each second semiconductor nanosheet (14A, 14B, 14C, etc.). In one embodiment, the first semiconductor material is selected from a semiconductor material that can be removed selective to the second semiconductor material. In some embodiments, the first semiconductor material is also selected from a semiconductor material that can be easier oxidized relative to the second semiconductor material. In one example, the first semiconductor material that provides each first semiconductor nanosheet (12A, 12B, 12C, etc.) may be composed of a silicon germanium alloy, while the second semiconductor material that provides each second semiconductor nanosheet (14A, 14B, 14C, etc.) may be composed of silicon.

The exemplary semiconductor structure of FIG. 1 can be formed utilizing processes that are well known in the art. In one example, an initial material stack of alternating layers of the first semiconductor material and the second semiconductor material can be formed on a bulk semiconductor substrate; the bulk semiconductor substrate is composed of a third semiconductor material that differs from the first semiconductor material, and is either the same or different from the second semiconductor material. In such an embodiment, substrate 10 is composed of the third semiconductor material. The initial material stack may be formed utilizing an epitaxial growth process (as defined herein below). The initial material stack can then be patterned by lithography and etching, or by any other patterning process that can provide a fin stack such as, for example, a sidewall image transfer process or a direct self assembly process.

In another example, a semiconductor-on-insulator (SOI) substrate is first provided that includes a first semiconductor material as the top semiconductor layer of the SOI substrate. Alternating layers of the second semiconductor materials and first semiconductor materials can be formed on the SOI substrate and then a patterning process can be used to provide the fin stacks. In such an embodiment, substrate 10 is composed of the insulator layer of the SOI substrate.

Each first and second semiconductor nanosheet has a vertical thickness that is substantially less than its width. In one example, each first and second semiconductor nanosheet has a vertical thickness of from 3 nm to 12 nm, and a width from 30 nm to 100 nm. At this point of the present application, each first and second semiconductor nanosheet of a particular fin stack has vertical end sidewalls that are vertically aligned to each other.

The sacrificial gate structure (16, 18) may include a single sacrificial material layer or a stack of two or more sacrificial materials (i.e., at least one sacrificial material portion). In one embodiment (not shown), the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. In the embodiment illustrated in FIG. 1, the sacrificial gate structure includes sacrificial gate portion 16 and a sacrificial dielectric cap portion 18. The at least one sacrificial material portion can be formed by forming a blanket layer (or layers) of a material (or various materials) and then patterning the material (or various materials) by lithography and etching. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, or atomic layer deposition (ALD).

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of said sacrificial materials), lithography and etching can be used to pattern the sacrificial material stack (or any subset of said sacrificial materials) and to provide the sacrificial gate structure (16, 18). The remaining portion of the sacrificial gate dielectric material constitutes a sacrificial gate dielectric portion (not shown), the remaining portion of the sacrificial gate material constitutes a sacrificial gate portion 16, and the remaining portion of the sacrificial dielectric cap material constitutes a sacrificial dielectric cap portion 18.

After providing the sacrificial gate structure (16, 18), a gate spacer 20 can be formed on exposed sidewall surfaces of the sacrificial gate structure (16, 18); the gate spacer 20 is formed around the entire sidewalls of the sacrificial gate structure (16, 18). The gate spacer 20 can be formed by first providing a dielectric spacer material and then etching the dielectric spacer material. Examples of dielectric spacer materials that may be employed in the present application include dielectric oxides, dielectric nitrides and/or dielectric oxynitrides. Alternatively, the dielectric spacer material that provides gate spacer 20 may be a dielectric material having a dielectric constant of less than silicon dioxide; a dielectric material having a dielectric constant of less than silicon dioxide can be referred to as a low k dielectric material. In one example, SiBCN may be used as a low k dielectric material that can provide gate spacer 20. The dielectric spacer material may be provided by a deposition process including, for example, chemical vapor deposition (CVD), plasma enhanced chemical vapor deposition (PECVD), or physical vapor deposition (PVP). The etch used to provide the gate spacer 20 may comprise a dry etching process such as, for example, reactive ion etching.

Figure 2:
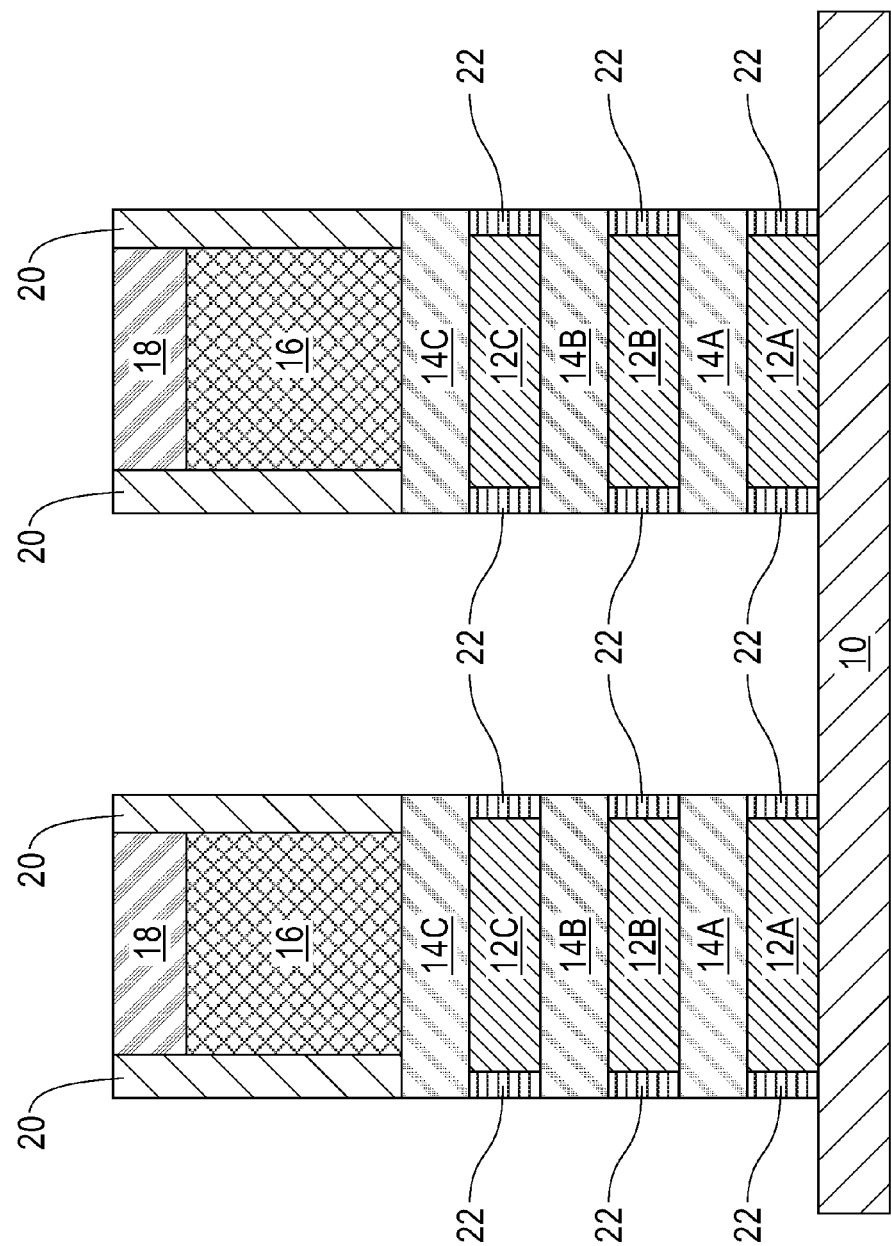
FIG. 2 is a cross sectional view of the exemplary semiconductor structure of FIG. 1 after thermally oxidizing end portions of each first semiconductor nanosheet to provide oxide end regions.

Referring now to FIG. 2, there is illustrated the exemplary semiconductor structure of FIG. 1 after thermally oxidizing end portions of each first semiconductor nanosheet (12A, 12B, 12C, etc.) to provide oxide end regions 22. In some embodiments, this thermal oxidation step may be omitted. Although not shown and in some embodiments, oxide end regions may also be formed within each second semiconductor nanosheet (14A, 14B, 14C, etc.). The oxide end regions that are formed within each second semiconductor nanosheet (14A, 14B, 14C, etc.) are much thinner as compared to the oxide end regions 22 within each first semiconductor nanosheet (12A, 12B, 12C, etc.). In cases in which the each first semiconductor nanosheet (12A, 12B, 12C, etc.) comprises a silicon germanium alloy, while the second semiconductor material that provides each second semiconductor nanosheet (14A, 14B, 14C, etc.) comprises silicon, oxide end regions are formed in each of the semiconductor nanosheets.

When employed the thermal oxidation may be performed by annealing the structure shown in FIG. 1 in an oxygen-containing ambient under conditions sufficient to form the oxide end regions 22. The term "oxygen-containing ambient" denotes an ambient that contains oxygen. Examples of such oxygen-containing ambient include, ozone, air, $O_2$, or $NO_2$. According to an exemplary embodiment, thermal oxidation may be carried out at a temperature of from 750° C. to 1000° C. for a duration of from about 5 seconds to about 5 minutes. The use of thermal oxidation provides a means to effectively control the amount of first semiconductor nanosheet (12A, 12B, 12C, etc.) to be subsequently removed (i.e., recessed) to provide a gap having a controlled lateral thickness that is formed beneath each second semiconductor nanosheet (14A, 14B, 14C, etc).

Figure 3:
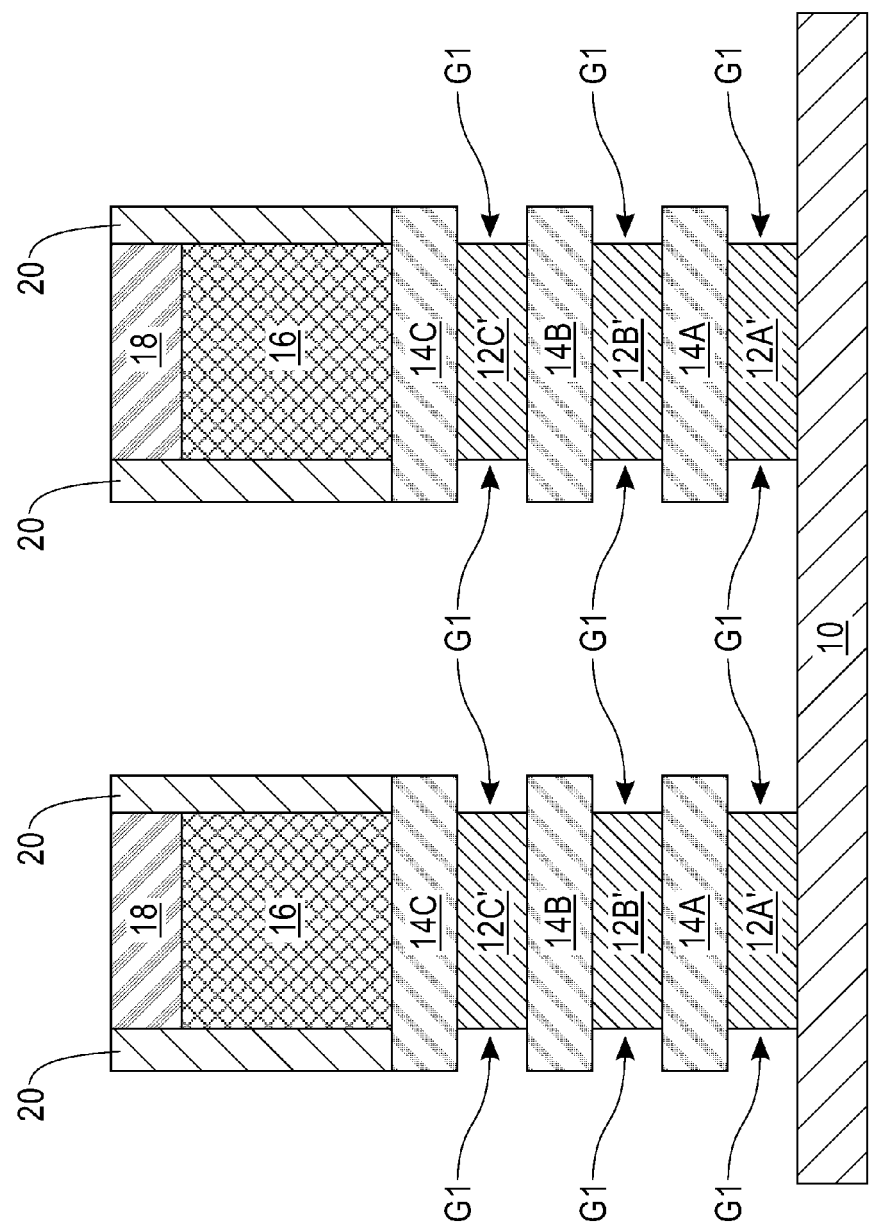
FIG. 3 is a cross sectional view of the exemplary semiconductor structure of FIG. 2 after removing the oxide end regions of each first semiconductor nanosheet to provide a gap between each second semiconductor nanosheet.

Referring now to FIG. 3, there is illustrated the exemplary semiconductor structure of FIG. 1 after removing the oxide end regions 22 of each first semiconductor nanosheet (12A, 12B, 12C, etc.) to provide a gap G1 between each second semiconductor nanosheet (14A, 14B, 14C, etc.). The gap G1 has a lateral thickness from 2 nm to 6 nm.

The removal of the oxide end regions 22 of each first semiconductor nanosheet (12A, 12B, 12C, etc.) may be performed utilizing an etch that removes the oxide end regions 22 selective to the dielectric spacers 20, the sacrificial gate structure (16, 18), substrate 10 and the semiconductor materials that provide each semiconductor nanosheet. In one example, the etch is a chemical wet etch process in which HF is employed as the etchant.

The remaining portions of each first semiconductor nanosheet (12A, 12B, 12C, etc.) may be referred to herein as a recessed first semiconductor nanosheet (12A', 12B', 12C', etc.). Each recessed first semiconductor nanosheet (12A', 12B', 12C', etc.) has a width that is less than the width of each original first semiconductor nanosheet (12A, 12B, 12C, etc.). Although not shown and in some embodiments, each second semiconductor nanosheet (14A, 14B, 14C, etc.) may also be recessed during this step of the present application. Each recessed second semiconductor nanosheet has a width that is less than a width of each original second semiconductor nanosheet (14A, 14B, 14C, etc.). The width of each second semiconductor nanosheet (14A, 14B, 14C) or each recessed second semiconductor nanosheet is greater than the width of each recessed first semiconductor nanosheet (12A', 12B', 12C', etc.). In one embodiment in which oxide end regions are not formed into the end portions of each second semiconductor nanosheet (14A, 14B, 14C, etc.), the sidewalls of each second semiconductor nanosheet (14A, 14B, 14C, etc.) are vertically aligned with the outermost sidewalls of the gate spacer 20. In other embodiments in which oxide end regions are formed into the end portions of each second semiconductor nanosheet (14A, 14B, 14C, etc.), the sidewalls of each second semiconductor nanosheet (14A, 14B, 14C, etc.) is located inward from the outermost sidewalls of the gate spacer 20.

In some embodiments, the recessing of each first semiconductor nanosheet (12A, 12B, 12C, etc.) may be performed directly on the exemplary semiconductor structure shown in FIG. 1. In such an embodiment, the recess comprises an etchant that is selective in removing end portions of each first semiconductor nanosheet (12A, 12B, 12C, etc.) relative to the second semiconductor material that provides each second semiconductor nanosheet (14A, 14B, 14C, etc.). In one example, and when each first semiconductor nanosheet (12A, 12B, 12C, etc.) is composed of a silicon germanium alloy, and each second semiconductor nanosheet (14A, 14B, 14C, etc.) is composed of silicon, gaseous HCl may be used as the etchant.

Figure 4:
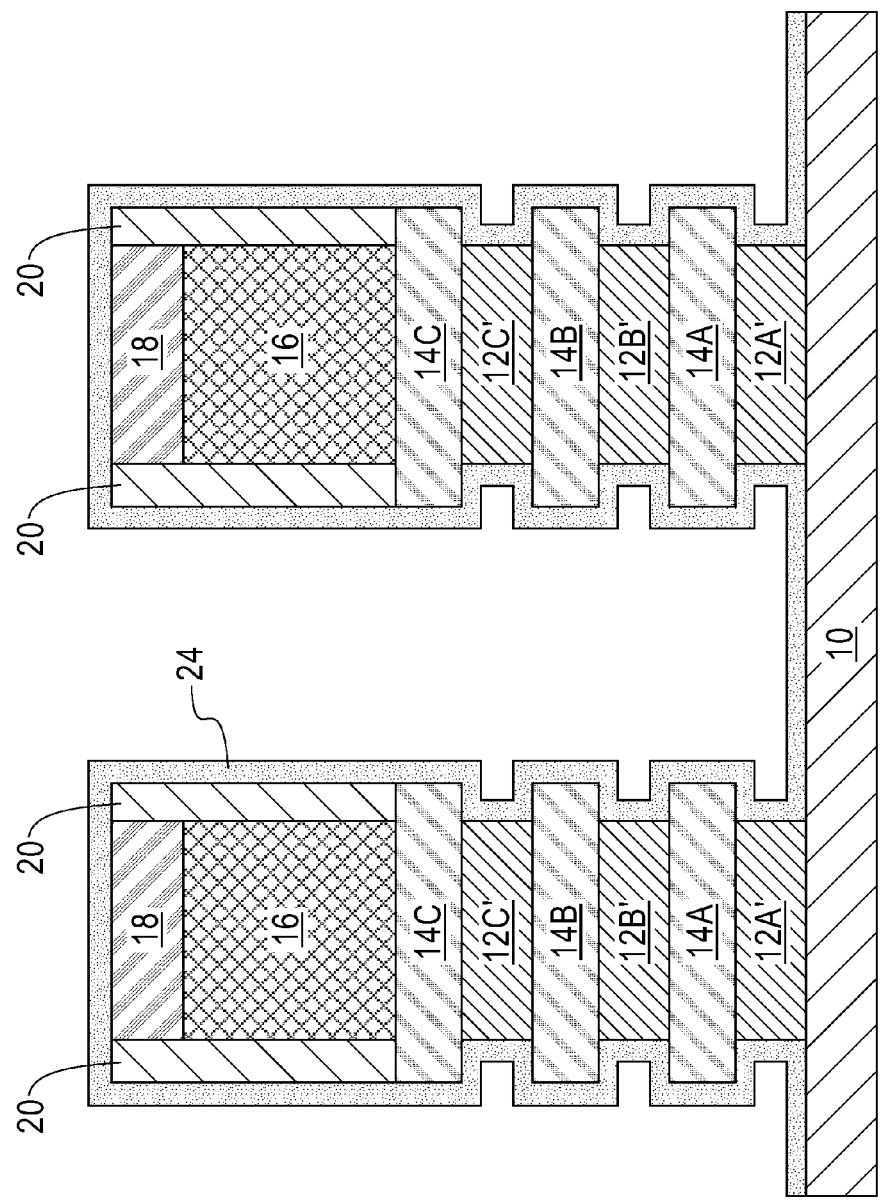
FIG. 4 is a cross sectional view of the exemplary semiconductor structure of FIG. 3 after forming an inner spacer material layer on physically exposed surfaces of the gate spacer, the sacrificial gate structure, the remaining portions of each first semiconductor nanosheet, each second semiconductor nanosheet and the substrate, and within a portion of each gap.

Referring now to FIG. 4, there is illustrated the exemplary semiconductor structure of FIG. 3 after forming an inner spacer material layer 24 on physically exposed surfaces of the gate spacer 20, the sacrificial gate structure (16, 18), the remaining portions of each first semiconductor nanosheet (12A', 12B', 12C', etc), each second semiconductor nanosheet (14A, 14B, 14C, etc.) and the substrate 10, and within a portion of each gap G1.

The inner spacer material layer 24 comprises a spacer dielectric material that differs from the spacer material that provides each gate spacer 20. In one embodiment, and when each gate spacer 20 comprises SiBCN, the inner spacer material layer 24 may be composed of a high k dielectric material (i.e., a dielectric material having a dielectric constant of greater than silicon dioxide) such as, for example, silicon nitride or a dielectric metal oxide such as defined herein below for the gate dielectric material of the functional gate structure. The inner spacer material layer 24 is a conformal layer that follows the contour of the structure it is disposed on. The inner spacer material layer 24 may be formed utilizing a conformal deposition process such as, for example, atomic layer deposition. The inner spacer material layer 24 may have a thickness from 5 nm to 10 nm.

Figure 5:
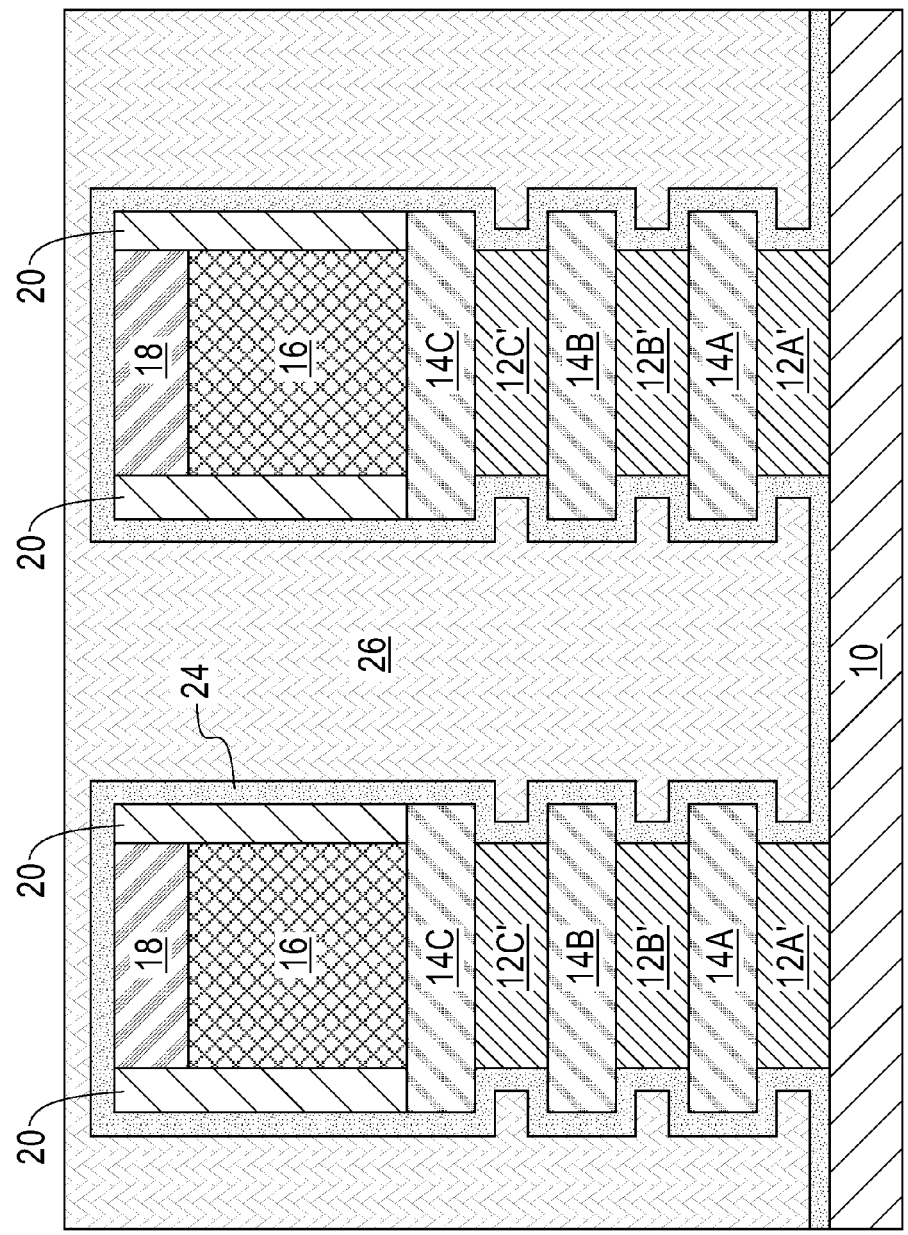
FIG. 5 is a cross sectional view of the exemplary semiconductor structure of FIG. 4 after forming a dielectric material layer on the inner spacer material layer.

Referring now FIG. 5, there is illustrated the exemplary semiconductor structure of FIG. 4 after forming a dielectric material layer 26 on the inner spacer material layer 24. The dielectric material layer 26 is composed of a different dielectric material than the inner spacer material layer 24. In one embodiment, the dielectric material layer 26 is composed of a flowable oxide. The dielectric material layer 26 may be formed utilizing a conventional deposition process such as, for example, chemical vapor deposition or plasma enhanced chemical vapor deposition.

Figure 6:
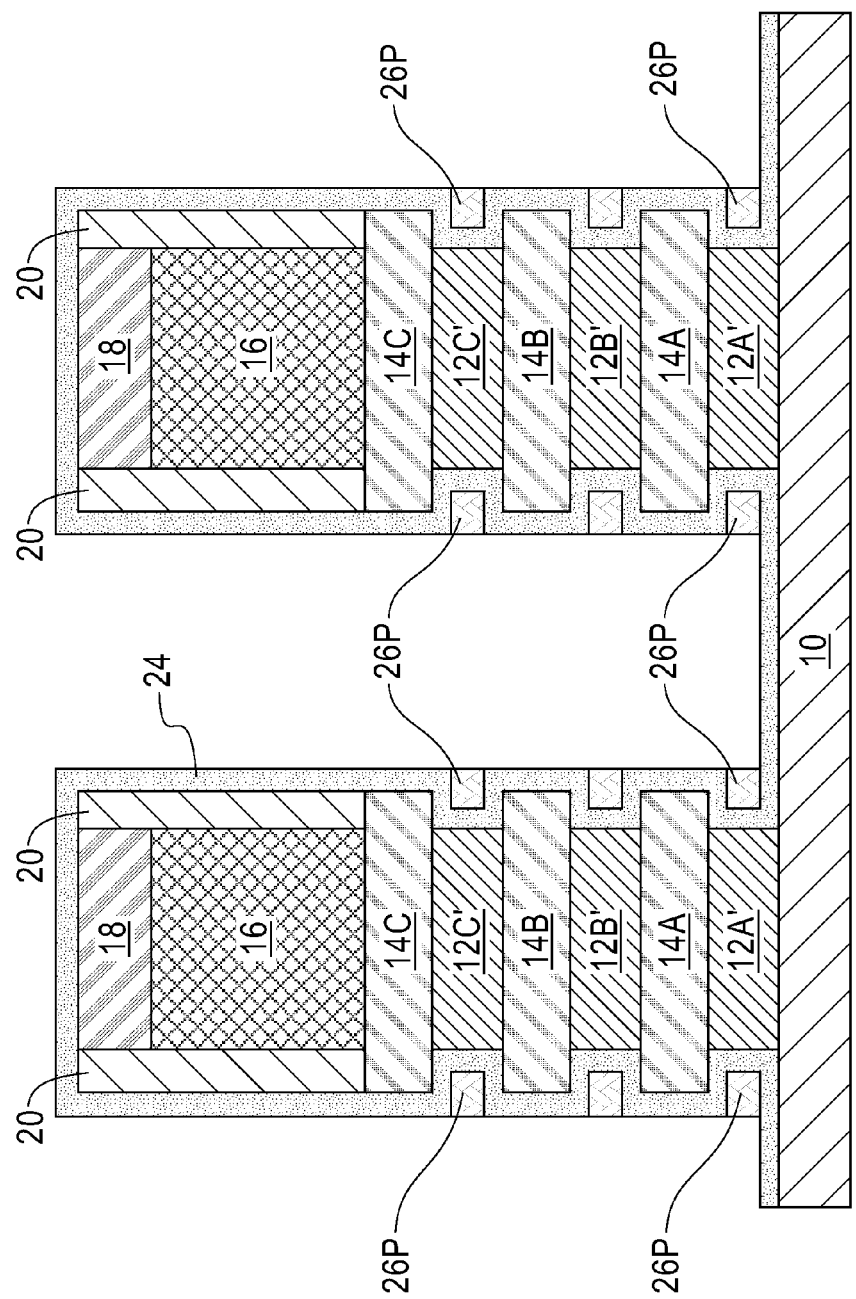
FIG. 6 is a cross sectional view of the exemplary semiconductor structure of FIG. 5 after recessing the dielectric material layer, wherein a portion of the dielectric material layer remains on the inner spacer material layer that is located in each gap.

Referring now to FIG. 6, there is illustrated the exemplary semiconductor structure of FIG. 5 after recessing the dielectric material layer 24, wherein a portion of the dielectric material layer remains on the inner spacer material layer 24 that is located in each gap G1. Each remaining portion of the dielectric material layer 24 may be referred to herein as a dielectric material plug 26P.

The recessing of the dielectric material layer 24 utilizes inner spacer material layer 24, the gate spacer 20 and the sacrificial gate structure (16, 18) as an etch mask. The recessing of the dielectric material layer 24 may be performed utilizing an etchant that is selective in removing the dielectric material that provides the dielectric material layer 24.

Referring now to FIG. 7, there is illustrated the exemplary semiconductor structure of FIG. 6 after removing the inner spacer material layer 24 not protected by the remaining portion of the dielectric material layer 26 (i.e., dielectric material plug 26P) in each gap G1, while maintaining a portion of the inner spacer material layer 24 in each gap G1. Each remaining portion of the inner spacer material layer 24 may be referred to herein as an inner spacer liner 24P.

Each inner spacer liner 24P is C shaped and is located in a portion of the gap G1 that is located between each second semiconductor nanostructure. Each C shaped inner spacer liner 24P has a vertical portion, that at this point of the present application, physically contacts the sidewalls of one of the recessed first semiconductor nanosheets (12A', 12B', 12C', etc.), an upper horizontal portion that contacts a portion of a bottommost surface of one of the second semiconductor nanosheets (14A, 14B, 14C, etc.) and a lower horizontal portion that contacts either a topmost surface of one of the second semiconductor nanosheets (14A, 14B, 14C) or a topmost surface of the substrate 10. As is shown in FIG. 7, each dielectric material plug 26P extends beyond an outermost edge of the C-shaped inner spacer liner 24P.

The removal of the inner spacer material layer 24 not protected by the remaining portion of the dielectric material layer 26 (i.e., dielectric material plug 26P) in each gap G1 utilizes the gate spacer 20 and the sacrificial gate structure (16, 18) as an etch mask. The removal of the inner spacer material layer 24 not protected by the remaining portion of the dielectric material layer 26 (i.e., dielectric material plug 26P) in each gap G1 can be performed utilizing a selective etching process. In one example, and when the inner spacer material layer 24 is composed of silicon nitride, hot phosphoric acid may be used as the etchant.

Figure 8:
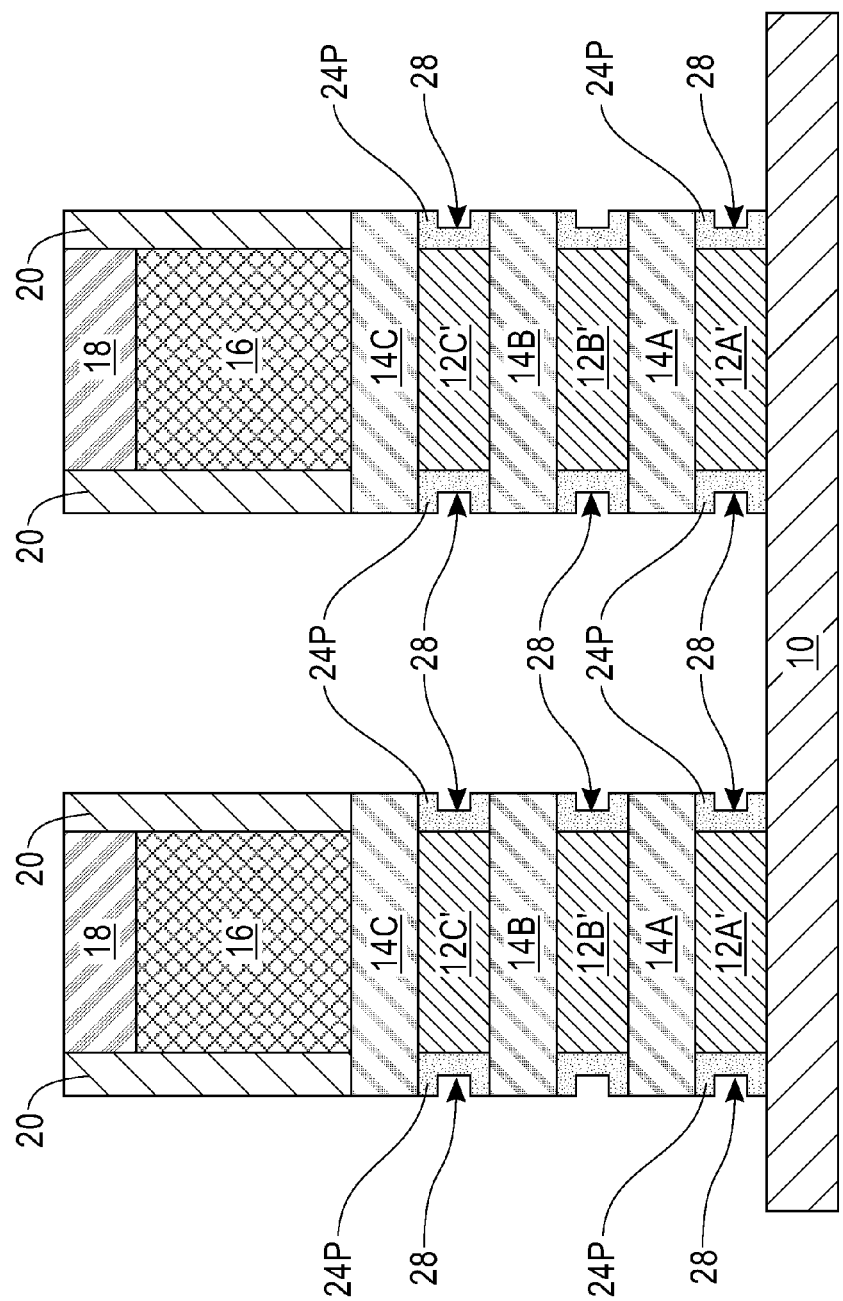
FIG. 8 is a cross sectional view of the exemplary semiconductor structure of FIG. 7 after removing each remaining portion of the dielectric material layer in each gap.

Referring now to FIG. 8, there is illustrated the exemplary semiconductor structure of FIG. 7 after removing each remaining portion of the dielectric material layer 24 (i.e., dielectric material plug 26P) in each gap G1. The removal of each dielectric material plug 26P may be performed utilizing an etching process that is selective in removing the dielectric material plug 26P relative to the inner spacer liner 24P. After removing each dielectric material plug 26P, a space 28 is formed between the upper and lower horizontal portions of each inner spacer liner 24P.

Referring now to FIG. 9, there is illustrated the exemplary semiconductor structure of FIG. 8 after forming a source/drain (S/D) semiconductor material structure 30 from vertical end sidewalls of each second semiconductor nanosheet (14A, 14B, 14C), wherein during the forming of the source/drain (S/D) semiconductor material structures 28, an air gap 32 is formed between the inner dielectric liner 24P and each source/drain (S/D) semiconductor material structure 30. In this embodiment, each air gap 32 includes a triangular portion and space 28.

Each source/drain (S/D) semiconductor material structure 30 includes a semiconductor material and a dopant. The semiconductor material that provides each S/D semiconductor material structure 30 can be selected from one of the semiconductor materials mentioned above for the second semiconductor material that provides each second semiconductor nanosheet (14A, 14B, 14C, etc.). In some embodiments of the present application, the semiconductor material that provides each S/D semiconductor material structure 30 may comprise a same semiconductor material as that which provides each second semiconductor nanosheet (14A, 14B, 14C, etc.). In one example, silicon may be used for each second semiconductor nanosheet (14A, 14B, 14C, etc.) and each source/drain semiconductor material structure 30. In other embodiments of the present application, the semiconductor material that provides each S/D semiconductor material structure 30 may comprise a different semiconductor material than that which provides each second semiconductor nanosheet (14A, 14B, 14C, etc.). For example, the semiconductor material that provides each S/D semiconductor material structure 30 may comprise a silicon germanium alloy, while each second semiconductor nanosheet (14A, 14B, 14C, etc.) may comprise silicon.

The dopant that is present in each S/D semiconductor material structure 30 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in the each S/D semiconductor material structure 30 can be introduced into the precursor gas that provides each S/D semiconductor material structure 30. In another embodiment, the dopant can be introduced into an intrinsic semiconductor layer by utilizing one of ion implantation or gas phase doping. In one example, each S/D semiconductor material structure 30 comprises a silicon germanium alloy that is doped with a p-type dopant such as, for example, boron.

Each source/drain (S/D) semiconductor material structure 30 can be formed by an epitaxial growth (or deposition) process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, each source/drain (S/D) semiconductor material structure 30 may have a bottommost surface that has an epitaxial relationship with the exposed portion of the substrate 10 and/or each vertical end sidewall of the second semiconductor nanosheet (14A, 14B, 14C, etc.).

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 450° C. to 900° C. Although higher temperature typically results in faster deposition, the faster deposition may result in crystal defects and film cracking. The epitaxial growth of each source/drain (S/D) semiconductor material structure 30, can be performed utilizing any well known precursor gas or gas mixture. Carrier gases like hydrogen, nitrogen, helium and argon can be used.

In some embodiment, each source/drain (S/D) semiconductor material structure 30 has faceted (i.e., non-planar) surfaces. In some embodiments, each source/drain (S/D) semiconductor material structure 30 is bounded to the vertical end sidewalls of the second semiconductor nanosheets (14A, 14B, 14C, etc.) by <111> planes.

Referring now to FIG. 10, there is illustrated the exemplary semiconductor structure of FIG. 9 after replacing the sacrificial gate structure (16, 18) and each remaining first semiconductor nanosheet (i.e., recessed first semiconductor nanosheets (12A', 12B', 12C', etc.)) with a functional gate structure (36, 38).

The replacing of the sacrificial gate structure (16, 18) and each remaining first semiconductor nanosheet (i.e., recessed first semiconductor nanosheets (12A', 12B', 12C', etc.)) includes first forming a middle-of-the-line (MOL) dielectric material 34 on each source/drain (S/D) semiconductor material structure 30, wherein the MOL dielectric material 30 has a topmost surface that is coplanar with a topmost surface of the sacrificial gate structure (16, 18).

MOL dielectric material 34 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as MOL dielectric material 34. The use of a self-planarizing dielectric material as the MOL dielectric material 34 may avoid the need to perform a subsequent planarizing step.

In one embodiment, the MOL dielectric material 34 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the MOL dielectric material 34, a planarization process or an etch back process follows the deposition of the dielectric material that provides the MOL dielectric material 34. The thickness of the dielectric material that provides the MOL dielectric material 34 may vary depending on the type of dielectric material employed as well as the method that was employed in forming the same. In one embodiment, the dielectric material used to provide the MOL dielectric material 34 has a thickness from 80 nm to 500 nm. Other thicknesses that are greater or lesser than the range provided above can also be used for the dielectric material that provides the MOL dielectric material 34.

After providing the MOL dielectric material 34, a gate cavity (not shown) is provided by removing the sacrificial gate structure (16, 18) and then each remaining first semiconductor nanosheet (i.e., recessed first semiconductor nanosheets (12A', 12B', 12C', etc.)). In the present application the sacrificial gate structure (16, 18) is removed prior to each recessed first semiconductor nanosheets (12A', 12B', 12C', etc.). The removal of the sacrificial gate structure (16, 18) can be performed utilizing one or more anisotropic etching processes that is selective in removing the material (or materials) that provide the sacrificial gate structure (16, 18) relative to the MOL dielectric material 34, gate spacer 20 and each second semiconductor nanosheet (14A, 14B, 14C, etc).

The removal of each recessed first semiconductor nanosheets (12A', 12B', 12C', etc.), which suspends each semiconductor nanosheet (14A, 14B, 124, etc), may be performed by selectively etching each recessed first semiconductor nanosheets (12', 12B', 12C', etc.) relative to each second semiconductor nanosheet (14A, 14B, 14C, etc).

Next, a functional gate structure (36, 38) is formed in the gate cavity. By "functional gate structure" it is meant a permanent gate structure used to control output current (i.e., flow of carriers in the channel) of a semiconducting device through electrical or magnetic fields. The functional gate structure may include a gate dielectric portion 36 and a gate conductor portion 38. The gate dielectric portion 36 is located on physically exposed semiconductor material surfaces, while the gate conductor portion 38 is located on and between each gate dielectric portion 36.

The gate dielectric portion 36 may include a gate dielectric material. The gate dielectric material that provides the gate dielectric portion 36 can be an oxide, nitride, and/or oxynitride. In one example, the gate dielectric material that provides the gate dielectric portion 36 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 36.

The gate dielectric material used in providing the gate dielectric portion 36 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric portion 36 can have a thickness in a range from 1 nm to 10 nm. Other thicknesses that are lesser than, or greater than, the aforementioned thickness range can also be employed for the gate dielectric material that may provide the gate dielectric portion 36.

The gate conductor portion 38 can include a gate conductor material. The gate conductor material used in providing the gate conductor portion 38 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor portion 38 may comprise an nFET gate metal. In another embodiment, the gate conductor portion 38 may comprise a pFET gate metal. In the embodiment illustrated, the gate dielectric portion 38 on the left hand side may be a component of a first conductivity type nanosheet device, while the gate dielectric portion of the right hand side may be a component of a second conductive type nanosheet device, wherein the first conductive type differs from the second conductivity type.

The gate conductor material used in providing the gate conductor portion 38 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor portion 38 can have a thickness from 50 nm to 200 nm. Other thicknesses that are lesser than, or greater than, the aforementioned thickness range can also be employed for the gate conductor material used in providing the gate conductor portion 38.

The functional gate structure (36, 38) can be formed by providing a functional gate material stack of the gate dielectric material, and the gate conductor material. A planarization process may follow the formation of the functional gate material stack. After planarization, the topmost surface of the functional gate structure (36, 38) is coplanar with a topmost surface of both the MOL dielectric material 34 and the gate spacer 20.

FIG. 10 illustrates an exemplary structure of the present application that includes a plurality of vertically stacked and spaced apart semiconductor nanosheets (i.e., second semiconductor nanosheets (14A, 14B, 14C, etc.)) suspended above substrate 10, each semiconductor nanosheet (i.e., second semiconductor nanosheets (14A, 14B, 14C, etc.)) has a pair of vertical end sidewalls. A functional gate structure (36, 38) surrounds a portion of each semiconductor nanosheet (i.e., second semiconductor nanosheets (14A, 14B, 14C, etc.)). A source/drain (S/D) semiconductor material structure 30 extends from each vertical end sidewall of the semiconductor nanosheets (i.e., second semiconductor nanosheets (14A, 14B, 14C, etc.)) and is located on each side of the functional gate structure (36, 38). An inner spacer liner 24P is located between each of the semiconductor nanosheets (i.e., second semiconductor nanosheets (14A, 14B, 14C, etc.)) and physically contacts sidewalls of the functional gate structure (36, 38), and an air gap 32 is positioned between each inner spacer liner 24P and each source/drain (S/D) semiconductor material structure 30.

Referring now to FIG. 11, there is illustrated the exemplary structure of FIG. 7 after forming a source/drain (S/D) semiconductor material structure 30 from vertical end sidewalls of each second semiconductor nanosheet (14A, 14B, 14C, etc.), wherein during the forming of the source/drain (S/D) semiconductor material structures 30, an air gap 32 is formed between the inner dielectric liner 34P and each source/drain (S/D) semiconductor material structure 30. In this example, the dielectric material plugs 26P are maintained within the structure and the air gap 32 that is formed has only a triangular portion.

Each source/drain (S/D) semiconductor material structure 30 may include materials and dopants as described above. Also, each source/drain (S/D) semiconductor material structure 30 can be formed as described above.

Referring now to FIG. 12, there is illustrated the exemplary semiconductor structure of FIG. 11 after replacing the sacrificial gate structure (16, 18) and each remaining first semiconductor nanosheet (i.e., recessed first semiconductor nanosheets (12A', 12B', 12C', etc.)) with a functional gate structure (36, 38). The exemplary semiconductor shown in FIG. 12 can be formed utilizing the materials and processing steps mentioned above in forming the exemplary semiconductor structure shown in FIG. 10.

FIG. 12 illustrates another exemplary structure of the present application that includes a plurality of vertically stacked and spaced apart semiconductor nanosheets (i.e., second semiconductor nanosheets (14A, 14B, 14C, etc.)) suspended above substrate 10, each semiconductor nanosheet i.e., second semiconductor nanosheets (14A, 14B, 14C, etc.)) has a pair of vertical end sidewalls. A functional gate structure (36, 38) surrounds a portion of each semiconductor nanosheet (i.e., second semiconductor nanosheets (14A, 14B, 14C, etc.)). A source/drain (S/D) semiconductor material structure 30 extends from each vertical end sidewall of the semiconductor nanosheets (i.e., second semiconductor nanosheets (14A, 14B, 14C, etc.)) and is located on each side of the functional gate structure (36, 38). An inner spacer liner 24P is located between each of the semiconductor nanosheets (i.e., second semiconductor nanosheets (14A, 14B, 14C, etc.)) and physically contacts sidewalls of the functional gate structure (36, 38), a dielectric material plug 26P is located in a space between each inner dielectric liner 24P, and an air gap 32 is positioned between each dielectric material plug 26P/inner spacer liner 24P structure and each source/drain (S/D) semiconductor material structure 30.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a plurality of vertically stacked and spaced apart semiconductor nanosheets suspended above a substrate, each semiconductor nanosheet having a pair of vertical end sidewalls;
   a functional gate structure surrounding a portion of each semiconductor nanosheet of the plurality of vertically stacked and spaced apart semiconductor nanosheets;
   a source/drain (S/D) semiconductor material structure extending from each vertical end sidewall of the semiconductor nanosheets and located on each side of the functional gate structure;
   an inner spacer liner located between each of the semiconductor nanosheets and physically contacting sidewalls of the functional gate structure; and
   an air gap positioned between each inner spacer liner and each source/drain (S/D) semiconductor material structure.

2. The semiconductor structure of claim 1, wherein the inner spacer liner is C shaped and comprises a vertical portion that physically contacts the sidewalls of the functional gate structure, an upper horizontal portion that contacts a portion of a bottommost surface of one of the semiconductor nanosheets and a lower horizontal portion that contacts either a topmost surface of one of the semiconductor nanosheets or a topmost surface of the substrate.

3. The semiconductor structure of claim 2, further comprising a dielectric material plug filling in a space located between the upper horizontal portion and the lower horizontal portion of the inner spacer liner.

4. The semiconductor structure of claim 3, wherein the inner spacer liner comprises a first dielectric material and the dielectric material plug comprises a second dielectric material, wherein the second dielectric material differs from the first dielectric material.

5. The semiconductor structure of claim 3, wherein the dielectric material plug extends beyond the outermost edges of the upper horizontal portion and the lower horizontal portion of the inner spacer liner.

6. The semiconductor structure of claim 1, further comprising a middle-of-the-line (MOL) dielectric material located on each source/drain (S/D) semiconductor material structure, wherein the MOL dielectric material has a topmost surface that is coplanar with a topmost surface of the functional gate structure.

7. The semiconductor structure of claim 6, further comprising a gate spacer located on the topmost semiconductor nanosheet and between the MOL dielectric material and the functional gate structure.

8. The semiconductor structure of claim 1, wherein the source/drain (S/D) semiconductor material structures have faceted surfaces.

9. The semiconductor structure of claim 1, wherein each semiconductor nanosheet comprises silicon, and wherein each source/drain (S/D) semiconductor material structure is bounded to the vertical end sidewalls by <111> planes.

10. The semiconductor structure of claim 1, wherein the inner dielectric liner comprises a dielectric material that has a dielectric constant of greater than silicon dioxide.

11. The semiconductor structure of claim 1, wherein the air gap comprises a triangular portion.

* * * * *